United States Patent
Lin et al.

(10) Patent No.: US 11,482,622 B2
(45) Date of Patent: Oct. 25, 2022

(54) ADHESION STRUCTURE FOR THIN FILM TRANSISTOR

(71) Applicant: INTEL CORPORATION, Santa Clara, CA (US)

(72) Inventors: Kevin Lin, Beaverton, OR (US); Abhishek Sharma, Hillsboro, OR (US); Carl Naylor, Hillsboro, OR (US); Urusa Alaan, Hillsboro, OR (US); Christopher Jezewski, Portland, OR (US); Ashish Agrawal, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 807 days.

(21) Appl. No.: 16/214,706

(22) Filed: Dec. 10, 2018

(65) Prior Publication Data

US 2020/0185532 A1 Jun. 11, 2020

(51) Int. Cl.
*H01L 29/786* (2006.01)
*H01L 29/66* (2006.01)
(Continued)

(52) U.S. Cl.
CPC .. *H01L 29/78618* (2013.01); *H01L 21/02568* (2013.01); *H01L 21/76805* (2013.01); *H01L 21/76831* (2013.01); *H01L 21/76895* (2013.01); *H01L 29/24* (2013.01); *H01L 29/41733* (2013.01); *H01L 29/66969* (2013.01);
(Continued)

(58) Field of Classification Search
CPC ............. H01L 21/02568; H01L 21/768; H01L 21/76829; H01L 21/76831; H01L 21/76877; H01L 21/76895; H01L 21/76898; H01L 21/76816; H01L 21/76805; H01L 29/24; H01L 29/41; H01L 29/41766; H01L 29/66969; H01L 29/78603; H01L 29/78618;
(Continued)

(56) References Cited

U.S. PATENT DOCUMENTS

| | | | | |
|---|---|---|---|---|
| 2009/0078939 A1* | 3/2009 | Yamazaki | ............ | H01L 27/124 257/E33.001 |
| 2012/0298986 A1* | 11/2012 | Inoue | .................. | H01L 29/4908 257/E21.409 |

OTHER PUBLICATIONS

"Thin-Film Transistor-Liquid Crystal Display Market Segmentation and Analysis by Recent Trends, Development and Growth by Regions to 2023", retrieved from the Internet: https://redfieldherald.com/thin-film-transistor-liquid-crystal-display-market-segmentation-and-analysis-by-recent-trends-development-and-growth-by-regions-to-2023/[copy retrieved Oct. 24, 2018], 3 pages.

* cited by examiner

*Primary Examiner* — Cheung Lee
(74) *Attorney, Agent, or Firm* — Schwabe, Williamson & Wyatt, P.C.

(57) ABSTRACT

A transistor structure includes a layer of active material on a base. The base can be insulator material in some cases. The layer has a channel region between a source region and a drain region. A gate structure is in contact with the channel region and includes a gate electrode and a gate dielectric, where the gate dielectric is between the gate electrode and the active material. An electrical contact is on one or both of the source region and the drain region. The electrical contact has a larger portion in contact with a top surface of the active material and a smaller portion extending through the layer of (Continued)

active material into the base. The active material may be, for example, a transition metal dichalcogenide (TMD) in some embodiments.

22 Claims, 6 Drawing Sheets

(51) Int. Cl.
*H01L 21/02* (2006.01)
*H01L 21/768* (2006.01)
*H01L 29/24* (2006.01)
*H01L 29/417* (2006.01)

(52) U.S. Cl.
CPC .. *H01L 29/78603* (2013.01); *H01L 29/78696* (2013.01); *H01L 2221/1063* (2013.01)

(58) Field of Classification Search
CPC ......... H01L 29/78696; H01L 21/76807; H01L 2221/1063; H01L 29/41733
See application file for complete search history.

ADHESION STRUCTURE FOR THIN FILM TRANSISTOR

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. A thin-film transistor (TFT) is one type of FET that can be fabricated on a substrate, for example, by depositing and patterning thin films of semiconductor material, dielectric material, and metal.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Structures and methodologies are disclosed for thin-film transistors (TFTs), such as TFTs that utilize a transition metal dichalcogenide (TMD) layer or comparable materials, in accordance with some embodiments of the present disclosure. Adhesion between the TMD layer and the underlying substrate or base layer presents a challenge. In some embodiments, a source/drain (S/D) contact extends through the TMD layer and into the material below it. For example, the S/D contact has a first portion on top of the TMD layer and a second portion that extends through the TMD layer, where the second portion has a smaller cross-sectional size than the first portion of the contact on top of the TMD layer. S/D contacts formed in this manner may resemble a rivet or other fastener, in accordance with some embodiments. Such structures can exhibit improved conductivity compared to metal contacts on only the top of the TMD material layer since the second portion of the contact intersects the plane of electrical conductivity. Additionally, contacts formed in this manner function like a mechanical fastener to secure the TMD material layer to the substrate below it.

Therefore, the present disclosure relates to methodologies for forming source and drain contacts through TMD monolayers in transistor structures. Such methodologies can also be used for forming gate structures with TMD material layers or other suitable materials, some of which are semiconductors. Numerous embodiments and variations will be apparent in light of this disclosure.

General Overview

Thin-film transistors (TFTs) can be made using a variety of active materials, including Group III-V semiconductors, Group IV semiconductors, and transition metal dichalcogenide (TMD) materials. TMD materials can exhibit properties similar to semiconductors, metals, or superconductors. For example, some TMD materials have superconductivity and very large magnetoresistance due to the structure of the material. For example, a TMD layer may be a monolayer or several monolayers thick, where interaction of large atoms and electrical conductivity occurs in a generally two-dimensional planar structure. Part of the electronic performance of TMD materials derives from the weak van der Waals forces between atoms of the material. However, these weak forces also result in poor adhesion to the underlying layer. In some instances, adhesion of the TMD material to a substrate (or other structures) can be improved by introducing covalent bonds. This approach, however, reduces the performance of the TMD material. Thus, a challenge exists for achieving both high-conductivity and satisfactory adhesion with TMD and other comparable materials.

In accordance with an embodiment of the present disclosure, a thin-film transistor (TFT) includes a base or substrate of an electrically insulating material. An etch-stop material, such as silicon nitride or alumina, may be formed on the substrate. Each TFT device may be defined by a relatively thin mesa of active material on the insulating substrate. The active material can be a TMD material or semiconductor material with a thickness up to 10 nm (e.g., 1-8 nm) in some example embodiments, no more than 5 nm (e.g., 2-5 nm) in other example embodiments. For each TFT device, source and drain contacts can be made with the respective source and drain regions of the mesa of active material. A gate structure contacts the active material between the source and drain and defines a channel region therebetween. Part of the source/drain contact extends through the active material. For example, the portion of the source/drain contact that extends through the active material has a smaller cross-sectional size than the portion of the contact on the top surface of the mesa, according to some embodiments. In one such embodiment, a smaller post of metal extends through the active material and is continuous with a larger head of metal on the top surface of the active material, similar to a rivet or nail. In another such embodiment, two or more smaller posts extend through the active material from the larger structure on the top surface of the active material. A similar approach can be used for the gate structure. For example, one or more smaller posts of gate dielectric extend through the active material to the etch-stop material on the substrate.

When the active material has a small thickness (~10 nm or less, or even ~5 nm or less), conductivity may occur primarily in the plane of the material layer. Thus, the portion of the contact that extends through the active material is located in the plane of electrical conductivity. By extending through the active material, such as when the active material is a TMD, the contact can improve adhesion between the active material and the substrate.

Thin-film transistors as variously provided herein can be part of an overall integrated circuit that includes one or more thin-film transistors. For example, the thin-film transistor can be structured as part of a memory cell or as part of an array of thin-film transistors. Concepts of the present disclosure are not limited to thin-film transistors and may also be applied to other semiconductor devices, such as devices utilizing TMD monolayers or otherwise relatively thin TMD layers, diodes, sensors, and the like.

Note that the expression "active material" or "active materials" as used herein simply refers to materials as variously noted herein, and is not intended to imply that the material is currently electrically biased or otherwise in a conductive state where carriers are mobile within the material, as will plainly be apparent and appreciated. For instance, a given active material need not be connected (whether directly or indirectly) to any power source whatsoever to be considered an active material. Nor does the active material need to be in a conducting state to be considered an active material.

Likewise, the use herein of expressions such as "channel region" or "channel portion" or "source region" or "source portion" or "drain region" or "drain portion" simply refers to specific locations of a transistor structure, and is not intended to imply that the transistor itself is currently electrically biased or otherwise in a conductive state where carriers are mobile within the channel region, as will be plainly apparent and appreciated. For instance, a given transistor need not be connected (whether directly or indirectly) to any power source whatsoever to have a channel region. Further note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

As also used herein, the expression "X includes at least one of A or B" refers to an X that may include, for example, just A only, just B only, or both A and B. To this end, an X that includes at least one of A or B is not to be understood as an X that requires each of A and B, unless expressly stated. For instance, the expression "X includes A and B" refers to an X that expressly includes both A and B. Moreover, this is true for any number of items greater than two, where "at least one" item is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, a thin-film transistor having source and drain contacts extending through the semiconductor material and/or a gate structure extending through the semiconductor material. For example, TEM can be useful to show a cross section of the device structure where the metal of the source and drain contacts has a smaller size as it extends through the semiconductor layer and has a larger size on the top surface of the semiconductor layer. Similarly, such tools can be used to detect a gate structure with one or more posts extending through the active layer. In some embodiments, the techniques described herein may be detected based on the benefits derived from their use, which includes TMD thin-film transistors having improved contact resistance, improved adhesion, and/or improved device performance.

Architecture

Figure 1:
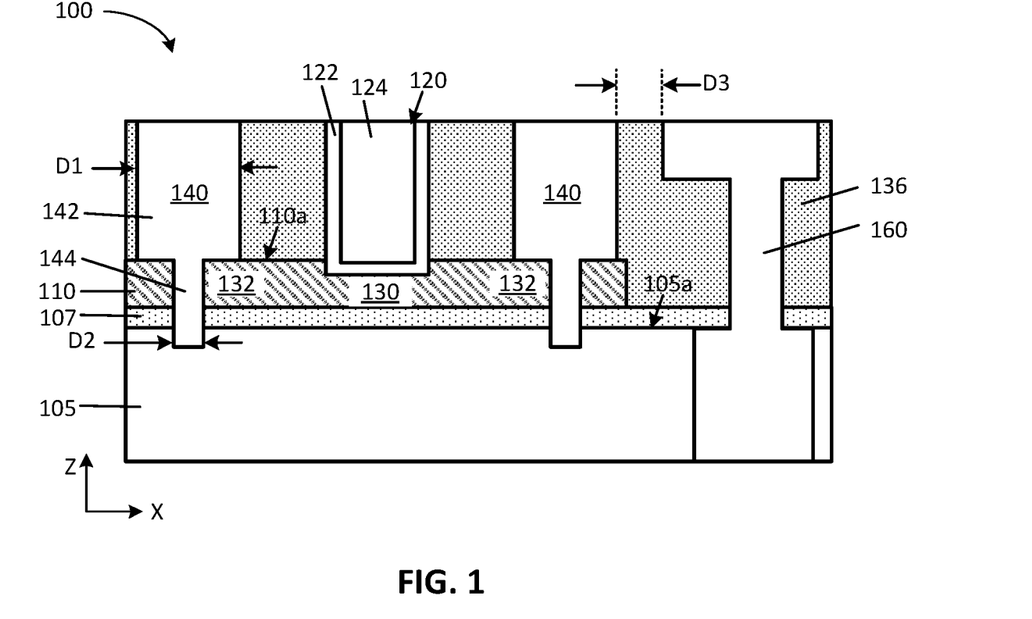
FIG. 1 illustrates a cross-sectional view of a thin-film transistor structure showing source and drain contacts that have a larger first portion on top of the active layer and a smaller second portion that extends through the active layer, in accordance with an embodiment of the present disclosure.

FIG. 1 illustrates a cross-sectional (X-Z) view of a thin-film transistor (TFT) 100 structure formed on a base or substrate 105, in accordance with an embodiment of the present disclosure. The TFT 100 may be one of many TFTs 100 arranged in an array or other arrangement of devices in an integrated circuit, as will be appreciated. The TFT 100 includes a mesa of active material 110 formed on a substrate 105, which include a layer of etch stop material 107 in the embodiment shown. A gate structure 120 in contact with the active material 110 includes a gate dielectric 122 and gate electrode 124, where the gate dielectric is between the active material 110 and the gate electrode 124. For example, the gate structure 120 is contacts the top surface 110a of the active material 110 and defines a channel region 130 in the active material 110 between source and drain (S/D) regions 132. The TFT 100 includes source/drain (S/D) contacts 140 in contact with respective source and drain regions 132 of the active material 110. An isolation material, such as an interlayer dielectric (ILD) 136, fills regions between various structures. As illustrated, the S/D regions 132 are on opposite side portions of the mesa of active material 110 and are spaced apart by the channel region 130 between them. Although shown on top of the active material 110 (e.g., a top gate configuration), the gate structure 120 in other embodiments may contact a bottom surface (e.g., a bottom gate configuration) or side surface of the active material 110. Numerous variations and embodiments will be apparent in light of the present disclosure.

In accordance with some embodiments, each S/D contact 140 includes a first portion 142 in contact with a top surface 110a of the active material 110 and a second portion 144 that extends through the active material 110. The first portion 142 and second portion 144 are continuous and monolithic. The first portion 142 has a greater size (e.g., cross-sectional dimension D1 in X-Y plane) compared to the size (e.g., cross-sectional dimension D2) of the second portion 144. For example, the first portion 142 is a block formed on top of and in contact with the S/D region 132 of the TFT 100. The first portion 142 may be recessed into the active material 110 in some embodiments. The second portion 144 is a post 144a or the like of smaller dimension that extends from the first portion 142 through the active material 110. In one example embodiment, the dimension D1 of the first portion 142 is 10 nm or greater than the dimension D2 of the second portion. The second portion 144 can include one, two, or more posts, in accordance with some embodiments.

The second portion 144 can have any cross-sectional shape, including round, square, hexagonal, rectangular, rectangular with rounded corners, polygonal, or irregular. In one example, the second portion 144 extends through the active material 110, through the etch-stop material 107, and into the substrate 105 below the etch-stop material 107. When the active layer 110 has a thickness of less than 10 nm, the second portion 144 has a total vertical length of 15-25 nm, or about 20 nm, for example. In another example, the second portion 144 extends through the active material 110 and part way into the etch-stop material 107, but does not extend into the substrate 105. In another example, the etch-stop material 107 is omitted and the second portion 144 extends through the active material 110 and into the substrate 105.

In one example, the substrate 105 is an insulator, such as an interlayer dielectric, an oxide (e.g., $SiO_2$), or polycrystalline silicon, to name a few examples. An example of the etch-stop material 107 is silicon nitride ($Si_3N_4$) or other suitable material with a thickness from 5 to 10 nm. The S/D contact 140 is made of or includes a metal or other suitable electrical conductor. For example, the S/D contacts 140 can be of gold, titanium, silver, or other suitable conductor.

The active material 110 can be selected from Group IV materials, Group III-V materials, or can be a transition metal dichalcogenide (TMD). TMDs have a general formula of MaXb, where a and b are from 0-10. The chalcogen atom X is selected from sulfur (S), selenium (Se), and tellurium (Te) and the metal atom M is selected from titanium (Ti), zirconium (Zr), silver (Ag), iron (Fe), zinc (Zn), osmium (Os), vanadium (V), manganese (Mn), gold (Au), cadmium (Cd), mercury (Hg), niobium (Nb), technetium (Tc), tantalum (Ta), hafnium (Hf), cobalt (Co), ruthenium (Ru), chromium (Cr), copper (Cu), palladium (Pd), rhodium (Rh), nickel (Ni), molybdenum (Mo), tungsten (W), iridium (Ir), rhenium (Re), and platinum (Pt). Examples of particular TMDs have a formula of $MX_2$ and include $MoS_2$, $WS_2$, $MoSe_2$, $WSe_2$, $WTe_2$, and $MoTe_2$. The TMD may be characterized as a semiconductor, metal, or superconductor depending on its composition.

In some embodiments, the active layer 110 can be a semiconductor material with a single-crystal, polycrystalline, or amorphous structure, in accordance with some embodiments. For example, in some embodiments, the active layer is amorphous semiconductor material, such as hydrogenated amorphous silicon (a-Si:H), polysilicon, zinc oxide (ZnO), indium gallium zinc oxide (IGZO), indium-zinc oxide (IZO), indium-molybdenum oxide (IMO), or zinc-tin oxide (ZTO) to name a few examples. In other embodiments, the active layer can be any one of a variety of polycrystalline semiconductors including, for example, zinc oxynitride (ZnON, such as a composite of zinc oxide (ZnO) and zinc nitride ($Zn_3N_2$), or of ZnO, $ZnO_xN_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like. In yet other embodiments, the active layer comprises a conductive oxide, such as magnesium zinc oxide (MgZnO).

In some embodiments, the active material 110 is an n-type or a p-type semiconductor material. An n-type active material 110 may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, and poly-III-V like indium arsenide (e.g., InAs). On the other hand, a p-type active material 110 may include one or more of amorphous silicon (a-Si), zinc oxide (e.g., ZnO), amorphous germanium (a-Ge), polysilicon (polycrystalline silicon or poly-Si), poly germanium (polycrystalline germanium or poly-Ge), poly-III-V (e.g., InAs), copper oxide (CuO), and tin oxide (SnO).

The active material 110 has a thickness from 2-5 nm in some embodiments. When the active material 110 is a TMD, the vertical material thickness may be one monolayer, or several monolayers with a total thickness of up to about 5 nm, for example. In some embodiments, the thickness of the active material 110 is no greater than 10 nm, including no greater than 8 nm, no greater than 5 nm, no greater than 4, nm, no greater than 3 nm, no greater than 2 nm, or no greater than 1 nm. Some such TMD materials have a monolayer thickness less than 1 nm.

In some embodiments, the TFT 100 is located adjacent an interconnect stack 160, which may extend vertically between two or more levels of the integrated circuit, as will be appreciated. In some such embodiments, a lateral distance D3 between the interconnect stack 160 and the TFT 100. Distance D3 can be measured as the horizontal distance between interconnect stack 160 and the nearest S/D contact 140, between interconnect stack 160 and active material 110, or between other points of reference. For example, the lateral distance D3 is one pitch away as defined by the minimum feature size of lithographic processes. In some embodiments, D3 is from 30 to 50 nm, including 35-45 nm, or about 40 nm. In some embodiments, the lateral distance D3 is no greater than 200 nm, including no greater than 150 nm, no greater than 125 nm, no greater than 100 nm, no greater than 80 nm, no greater than 70 nm, no greater than 60 nm, no greater than 50 nm, no greater than 40 nm, no greater than 30 nm, no greater than 20 nm, and no greater than 10 nm.

Figure 2:
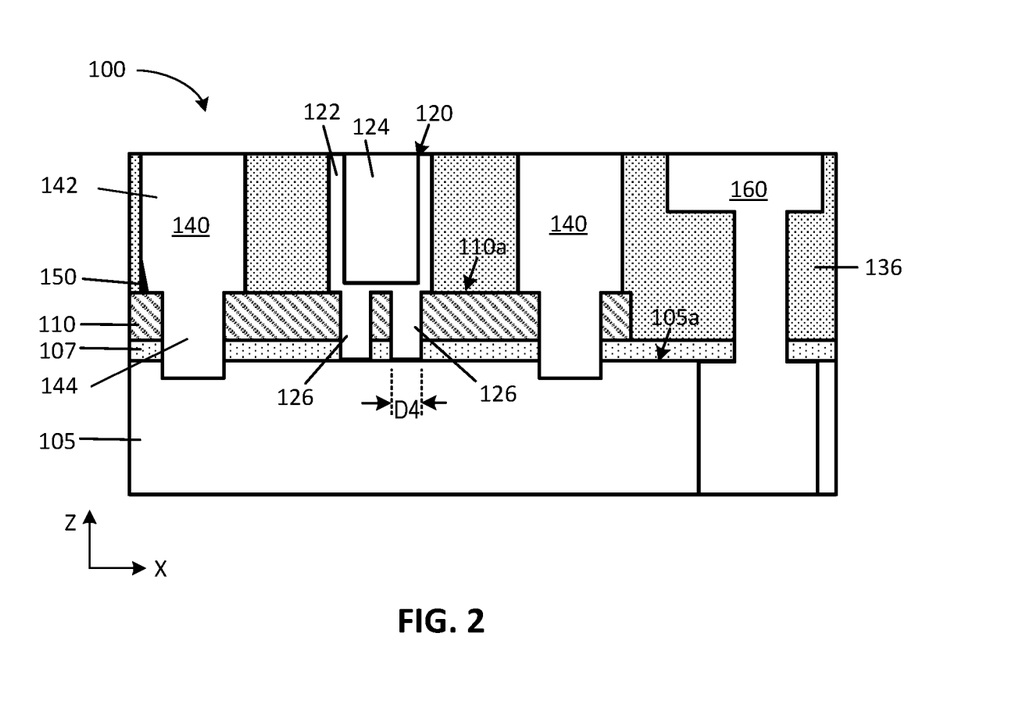
FIG. 2 illustrates a cross-sectional view of a thin-film transistor structure showing a variation on the source and drain contacts of FIG. 1 as well as a gate structure that includes gate posts extending through the active layer, in accordance with an embodiment of the present disclosure.

FIG. 2 illustrates a TFT 100 in accordance with another embodiment of the present disclosure. As with the embodiment described with reference to FIG. 1, each S/D contact 140 includes a second portion 144 that extends through the active material 110. As shown in this example, the size (e.g., diameter) of the second portion 144 is less than the size (e.g., diameter) of the first portion 142, although the difference between the sizes is less in this embodiment than as shown in FIG. 1. As also shown in FIG. 2, the gate structure 120 includes a first gate portion 125 and one or more gate posts 126 that extend connect to and extend down from the first gate portion 125. The gate post(s) 126 extend into or through the active material 110 and have a smaller cross-sectional dimension than the first gate portion 125 on the top of the active material 110 (e.g., on top surface 110a). Since the gate structure 120 is typically processed separately from the S/D contacts 140, the first gate portion 125 and/or the gate post(s) 126 are likely to extend to a different depth compared to the first and second portions 142,144, respectively, of the S/D contacts 140. In one embodiment, the gate post(s) 126 extend part way or completely through the active material 110 to the etch-stop material 107. In other embodiments, the gate post(s) 126 extend partially through the etch-stop material 107. In yet other embodiments, the gate post(s) 126 extend completely through the etch-stop material 107 and into the substrate 105. As noted above, some embodiments of TFT 100 may omit the etch-stop material 107.

Depending on the cross-sectional dimension D4 (e.g., diameter in the X-Y plane) of the gate post(s) 126, the gate post 126 may include only gate dielectric (e.g., a high-k dielectric material) or may include both gate dielectric 123 and gate electrode 124 (e.g., metal), where the gate dielectric 123 is between the active material 110 and the gate electrode 124. As shown in the example embodiment of FIG. 2, gate posts 126 include only the gate dielectric 123 material. In this example, the gate posts 126 extend through the active material 110 and etch-stop material 107 to the top surface 105a of the substrate 105. In some embodiments, the gate electrode 124 extends only part way (or not at all) through the active material 110 or part way through the etch-stop material 107. For example, when the dimension D4 of gate posts 126 is sufficiently small (e.g., ~5 nm), the gate dielectric 123 may close on itself and/or fill the etch recess for the gate post 126 during a conformal deposition process, for example. As such, no void remains to be filled with metal of the gate electrode 124. In some such embodiments, the gate electrode 124 resides above the top surface 110a of the active material 110 even though gate dielectric 123 extends through the active material 110 via the gate post(s) 126. In other such embodiments, the gate electrode 124 may extend part way into the active material 110 due to first gate portion 125 being recessed into the active material 110 or due to the gate electrode 124 extending at least partially into the gate post(s) 126.

In some embodiments, TFT 100 has a residual amount of spacer material 150 along part of the first portion 142 of the S/D contact 140. For example, the spacer material 150 is between the first portion 142 and the ILD 136 and/or between the first portion 142 and the active material 110. In another example, the spacer material 150 is along a vertical sidewall of the first portion 142 and/or along a horizontal wall of the first portion 142 between the first portion 142 and the active material 110. The spacer material 150 may result from incomplete removal of spacer material 150 in the first portion 142 during processing of the S/D contact 140, which is described in more detail below. Such residual amounts of spacer material 150 likely have a thickness of ~2 nm or less and may be found in a corner or along a sidewall, for example.

Figure 3:
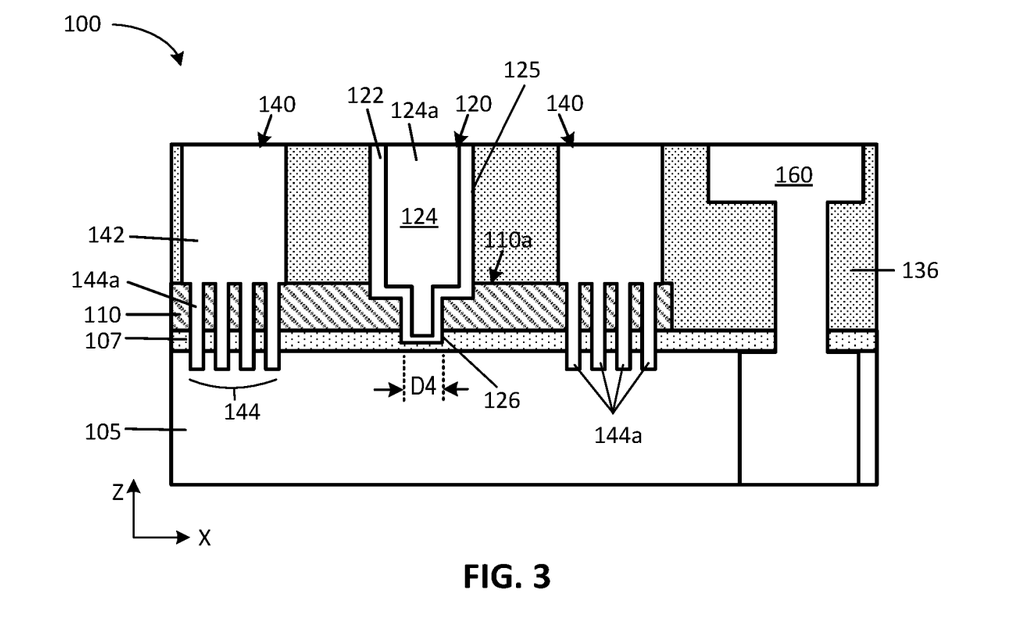
FIG. 3 illustrates a cross-sectional view of a thin-film transistor structure showing source and drain contacts that each include a plurality of posts extending through the active layer and showing part of the gate electrode extending into the gate post, in accordance with an embodiment of the present disclosure.

FIG. 3 illustrates a cross-sectional view of a TFT 100 in accordance with another embodiment of the present disclosure. Here, the second portion 144 of each S/D contact 140 includes a plurality of posts 144a extending through the active material 110. As discussed in more detail below, some such embodiments may be fabricated using directed self-alignment (DSA) co-polymers that tend to form organized patterns useful to create mask openings used to form the posts 144a. As also shown in FIG. 3, the first gate portion 125 is recessed into the top surface 110a of the active material 110 and the gate post 126 extends through the active material 110 and into the etch-stop material 107. The gate post 126 includes both gate dielectric 122 and gate electrode 124. In this embodiment, for example, the horizontal dimension D4 of the gate post 126 is sufficiently large so that a conformal deposition of gate dielectric 122 leaves an unfilled region in the gate post 126 that can be filled with metal of the gate electrode 124, for example. In other embodiments, the first gate portion 125 is on the top surface 110a of the active material 110 with the gate post(s) 126 extending into or through the active material 110 to or into the etch-stop material 107 or substrate 105. Numerous variations and embodiments will be apparent.

Figure 4:
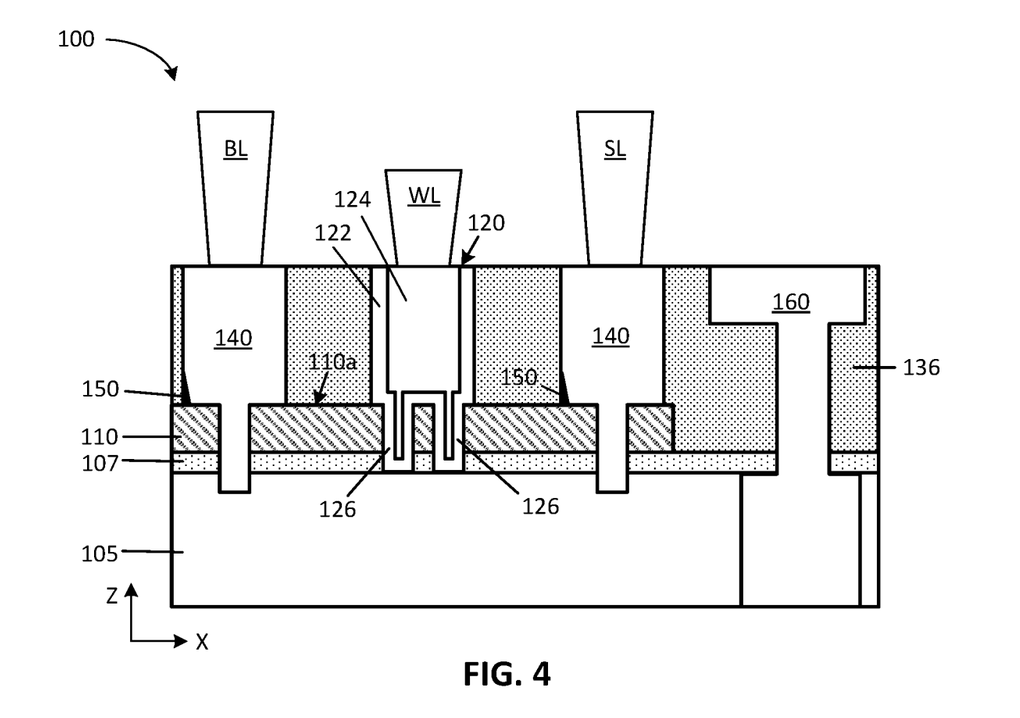
FIG. 4 illustrates a cross-sectional view of a thin-film transistor structure showing further variations on source and drain contacts and the gate structure, in addition to showing source line, bit line, and word line connections to the various contacts, in accordance with an embodiment of the present disclosure.

FIG. 4 illustrates a cross-sectional view of a TFT 100 in accordance with another embodiment of the present disclosure. Here, the gate structure 120 includes two gate posts 126 that extend through the active material 110. Each gate post 126 includes gate electrode 124 (e.g., metal) and gate dielectric 122, where the gate dielectric 122 is between the gate electrode 124 and the active material 110. In some embodiments, one or more of the S/D contacts 140 may include a residual amount of spacer material 150, such as in a corner of the structure.

As also illustrated in FIG. 4, TFT 100 has an example configuration for use in a memory structure that includes a bitline BL, a wordline WL, and a source line SL electrically coupled to the TFT 100. For example, the bitline BL is electrically connected to one of the S/D contacts 140 and the source line SL is electrically connected to the other of the S/D contacts 140. A wordline WL is electrically connected to the gate electrode 124. In an array of such TFTs 100, the bitline BL, wordline WL, and source line SL can be used to control on states, off states, and selection of a particular memory location, as will be appreciated.

Features shown in the embodiments of FIGS. 1-4 may be present in any of the embodiments discussed. Also, although S/D contacts 140 are shown as having the same geometry, it is contemplated that each S/D contact 140 may be processed separately and therefore result in having a different geometry, a different dimension, or a compositionally different material compared to another S/D contact 140 on the same TFT 100 or other TFT 100.

Fabrication Methodologies

Figure 5:
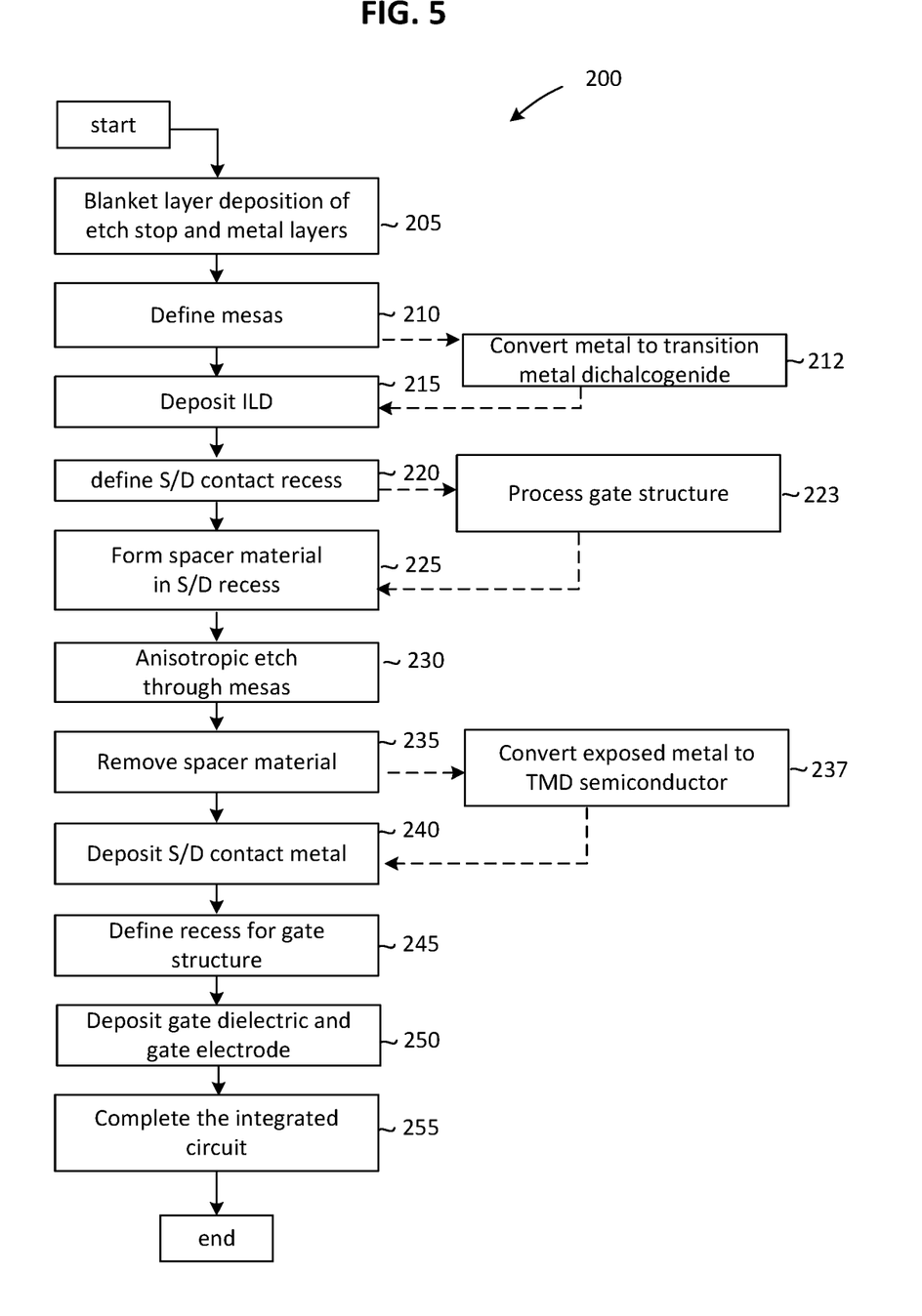
FIG. 5 illustrates a flow chart of processes in a method of fabricating a thin-film transistor, in accordance with an embodiment of the present disclosure.

Referring now to FIG. 5, a flow chart illustrates processes in a method 200 of fabricating a thin-film transistor 100 (TFT), in accordance with some embodiments. To facilitate understanding of processes in method 200, FIGS. 6A-6M will be discussed concurrently with processes of method 200. FIGS. 6A-6M illustrate cross-sectional views (X-Z) of example structures resulting from various processes in method 200. Method 200 is discussed below for fabrication of a TFT 100 with a transition metal dichalcogenide (TMD) material layer that begins with a metal. However, method 200 can alternately be performed for a TFT utilizing a semiconductor material, as will be appreciated.

In general, TFTs 100 according to the present disclosure can be fabricated using any suitable semiconductor fabrication techniques, including deposition, photolithography, wet or dry chemical etching processes, chemical mechanical polishing, deposition or epitaxial growth processes (e.g., CVD, PVD, ALD, VPE, MBE, LPE), melt regrowth, and/or any other suitable processing, as will be appreciated. The components of TFT 100 can be part of a backend process, such as the back end of line (BEOL) process of a semiconductor integrated circuit. As such, the components of TFT 100 can be fabricated as part of, or concurrently with, the metal interconnection layers of a semiconductor fabrication process. In example embodiments, fabrication of the components of TFT 100 can be part of the metal (interconnect) layer of a BEOL process. In another embodiment, the components of TFT 100 are fabricated on a substrate as part of a front end of line (FEOL) process. Method 200

In one embodiment, method 200 begins by depositing 205 a layer of metal on an insulating base or substrate 105. For example, the metal is deposited using blanket deposition techniques. In some embodiments, the substrate 105 includes an etch-stop material 107 (e.g., $Si_3N_4$) on an insulating material, such as an oxide, nitride, alumina ($Al_2O_3$), or glass. When not present, the etch-stop material 107 may first be deposited in a blanket layer on the insulating material, followed by deposition of the metal. The layer of etch-stop material 107 is useful in subsequent processing of the metal or semiconductor layer. Other insulating structures are acceptable as will be appreciated in light of the present disclosure. In some embodiments, the substrate 105 includes a bulk semiconductor with the insulating material on a top surface, such as an oxide or nitride layer formed on bulk silicon. Such embodiments may be used when the TFT is formed on a substrate that also includes other semiconductor devices, for example.

The insulating material of the substrate 105 can include one or more of silicon dioxide ($SiO_2$), silicon nitride ($Si_3N_4$), aluminum oxide ($Al_2O_3$), gallium oxide (GaO), titanium dioxide ($TiO_2$), hafnium dioxide ($HfO_2$), silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate, to name a few examples.

The etch-stop material 107 is compositionally different from the substrate 105, in accordance with some embodiments. Examples of suitable material for the etch-stop material 107 include electrically insulative materials such as aluminum oxide ($Al_2O_3$), silicon nitride (SiN), hafnium oxide ($HfO_2$), silicon aluminum oxide (SiAlO), hafnium silicon oxide (HfSiO), hafnium aluminum oxide (HfAlO), titanium dioxide ($TiO_2$), tantalum oxide ($Ta_2O_5$), hafnium tantalum oxide (HMO), aluminum tantalum oxide (AlTaO), aluminum nitride (AlN), silicon dioxide ($SiO_2$), and carbon-doped silicon dioxide ($SiO_2$:C) to name a few examples. In some embodiments, the material of the insulative structure is a high-κ dielectric having a dielectric constant greater than 3.9, including greater than 7, greater than 10, or greater than 15. The etch-stop material 107 may be deposited using ALD, CVD, or other suitable process, as will be appreciated.

Figure 6A:
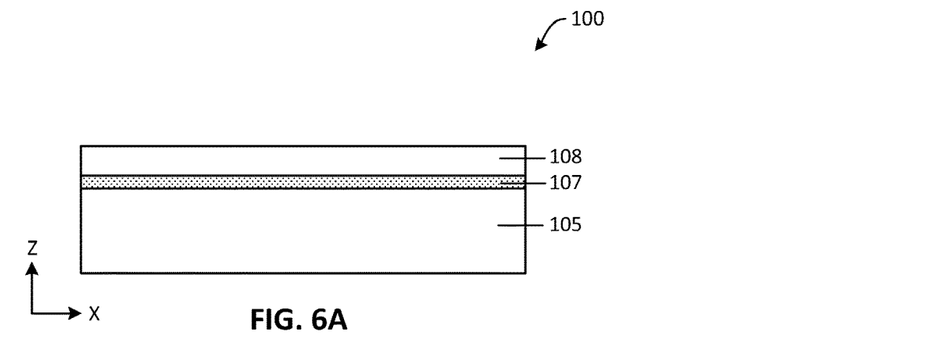
FIGS. 6A-6H illustrate example structures corresponding to processes in the method of fabrication, in accordance with some embodiments of the present disclosure.

FIG. 6A illustrates a cross-sectional view of an example substrate 105 with an etch-stop material 107 on the substrate 105 and layer of metal 108 on the etch-stop material 107. Note that the thicknesses of the various layers are not drawn to scale and the relative thicknesses of these features may differ substantially in some embodiments.

Method 200 continues with defining 210 mesas 109 in the metal layer. Process 210 may be performed, for example, using photolithography techniques that include masking certain regions and removing unmasked regions of the metal. Process 210 can be performed, for example, by forming a hard mask on top of the metal, patterning the hard mask to define the desired geometry, and etching the exposed metal regions to the etch-stop material 107, thereby removing the metal in those regions. The etching can be any suitable wet or dry etch process, or combination of such processes. In one embodiment, an anisotropic etch is used. In some embodiments, a combination of anisotropic etch and isotropic etch processes may be used. For example, 70-80% the etch is performed with an anisotropic etch process followed by an isotropic etch process for the remainder of the etch. Other variations will be appreciated in light of the present disclosure.

Alternately, defining 210 mesas can be performed in conjunction with depositing 205 the metal. For example, the metal is deposited on a sacrificial material (e.g., an oxide or photoresist) patterned with openings corresponding to the location of desired mesas 109. After blanket deposition of the metal, the sacrificial material is removed, leaving mesas 109 of the metal. In some embodiments, a plurality of mesas 109 are formed in an array, such as tens, hundreds, thousands, millions or more.

At this stage of processing, method 200 optionally continues with converting 212 the metal to a transition metal dichalcogenide (TMD) semiconductor. For example, a chalcogen gas is introduced to the process environment, resulting in a reaction with the metal that converts the metal to the TMD layer. In other embodiments, rather than deposition 205 of a metal and conversion 212 to TMD, the TMD layer can be formed using chemical vapor deposition, exfoliation, or molecular beam epitaxy techniques, as will be appreciated. In some such embodiments, deposition 205 of the metal may be replaced with deposition of a TMD precursor. Defining 210 mesas 109 of TMD layer can similarly be performed from blanket layers or as a result of deposition techniques, in accordance with some embodiments.

Figure 6B:
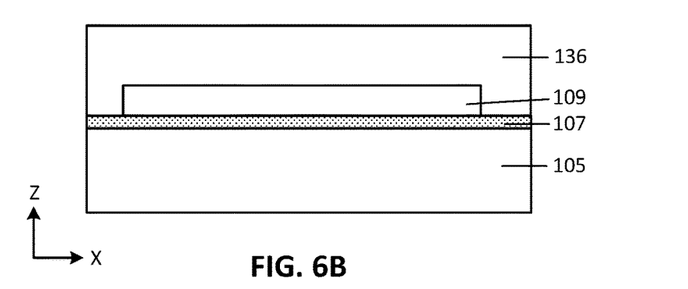

Method 200 continues with depositing 215 an interlayer dielectric (ILD) 136 over the mesas 109 of metal or TMD. In some embodiments, the ILD material 136 has a thickness from 50 nm to 500 nm and can be an insulating material, such as aluminum oxide ($Al_2O_3$), silicon nitride ($Si_3N_4$), silicon dioxide ($SiO_2$), carbon-doped silicon dioxide ($SiO_2$:C), to name a few examples. In some embodiments, the ILD material 136 is a low-κ dielectric having a dielectric constant below 3.9 (the dielectric constant for $SiO_2$). FIG. 6B illustrates a cross-sectional view of an example structure after depositing 215 the ILD 136 material over mesas 109.

Method 200 continues with defining 220 S/D contact vias 114 in the ILD material 136 and depositing 225 a liner material 116 along sidewalls of the vias 114. The contact vias 114 are aligned over and expose the source and drain regions 132 of the metal/TMD. For example, the vias 114 are positioned to expose the mesa 109 in locations corresponding to the S/D regions 132 of the TFT 100. Defining 220 vias 114 can be performed, for example, by applying and patterning a mask on the ILD layer 136, followed by opening vias 114 through the patterned mask using a wet or dry etch process.

A liner material 116, such as an insulator, is deposited 225 conformally. For example, the liner material 116 is deposited with a thickness of 5 nm or more on all exposed surfaces. An anisotropic etch can then be used to remove the liner material 116 from the horizontal surfaces of the structure, such as the top of the ILD material 136 and bottom of the vias 114. Such etch processing leaves a layer of liner material 116 on the vertical sidewalls of the vias 114.

Figure 6C:
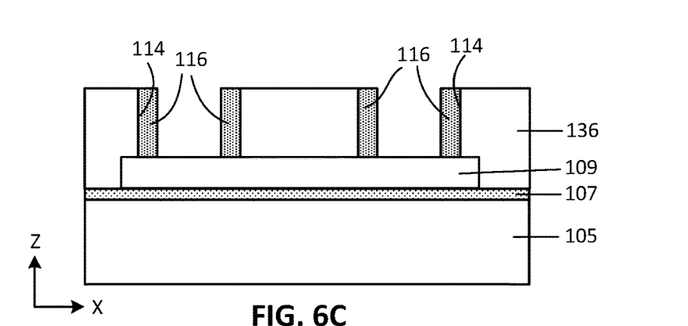

FIG. 6C illustrates a cross-sectional view of an example structure after processes 220 and 225 to define vias 114 for the first portion 142 of S/D contacts 140 and to form a liner material 116 along the sidewalls of the vias 114. The example resulting structure includes liner material 116 along the vertical sidewalls of the vias 114, thereby reducing the cross-sectional size (in the X-Y plane) of the vias 114. Liner material 116 has been removed from the top of the ILD material and the top surface of the mesa 109 at the bottom of the vias 114.

Method 200 continues with etching 230 through the exposed mesa 109 to define recesses for the second portion 144 of S/D contacts 140. Process 230 may be performed using an anisotropic etch that proceeds substantially vertically through the mesa 109 and into or through the etch-stop material 107. Etching 230 optionally proceeds through the etch-stop material 107 and into the substrate 105.

In some embodiments, method 200 optionally includes depositing and patterning a mask on the mesa 109 exposed through vias 114 prior to etching 235 the exposed mesa 109. The patterned defines a plurality of mask openings that can be used during etching 235 to define a plurality of posts 144a of the second portion 144 of the S/D contacts 140. For example, photoresist or a block copolymer for directed self-alignment (DSA) can be used, depending on the desired size of posts 144a. For example, the block copolymers are polystyrene and polymethyl methacrylate (PS-b-PMMA) in a solvent or carrier liquid. The block copolymer DSA solution is deposited on the mesa 109 exposed through vias 114. In some embodiments, the DSA solution is spin coated, sprayed, sputtered, dripped, or otherwise applied to the structure so that it enters the vias 114 and deposits on the exposed regions of the mesa 109. After depositing the DSA solution, annealing the block copolymers causes molecules of the block copolymers to self-align and define a pattern of circles, hexagons, rectangles, or other shape of one copolymer on a background of the other copolymer. For example, a PS-b-PMMA block copolymer solution can be annealed using a solvent vapor annealing (SVA) process with acetone, tetrahydrofuran (THF), or other suitable solvent. In another example, the PS-b-PMMA block copolymer solution can be annealed by heating at a temperature sufficient to vaporize the solvent, such as about 170° C. to about 230° C. In some embodiments, the DSA solution defines circles, hexagons, or the like with a diameter of 15 nm to about 30 nm. In some embodiments, the circles or hexagons have a larger size, such as 30 to 50 nm or 50 to 100 nm. After annealing, one of the block copolymers is removed to define mask openings in the copolymer coating. For example, a suitable solvent is selected to remove the first block copolymer (e.g., polystyrene) and leave the second block copolymer (e.g., polymethyl methacrylate) on the mesa 109. The second block copolymer can be used as a mask for etching 230 through the mesa 109 to define recesses corresponding to second portion 144 of the S/D contacts 140. Other suitable DSA solutions or lithographic processes can be used, as will be appreciated. After etching 230 through the mesa 109, the liner material 116 is removed 235 from the sidewalls of the vias 114. Any photoresist or DSA copolymer used to pattern openings for the second portion 144 of the S/D contact is also removed.

Figure 6D:
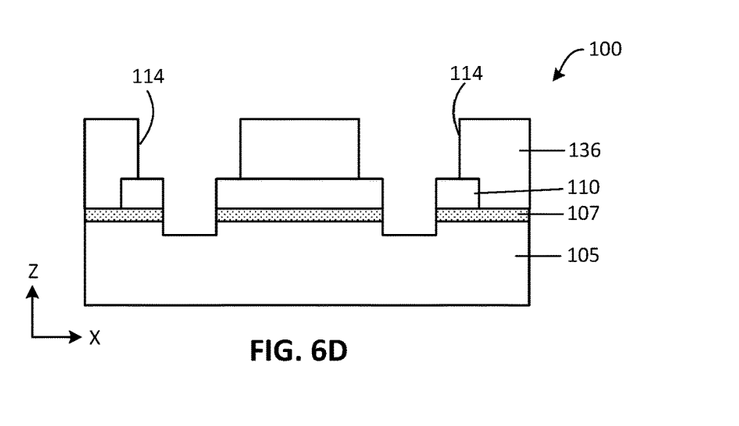

In some embodiments, method 200 continues with converting 237 the exposed metal to TMD material. As noted above, the metal may be converted to TMD after defining mesas of the metal. Process 237 may be performed by flowing a chalcogen gas over the metal exposed by vias 114. Other suitable processes may be used, as will be appreciated. FIG. 6D illustrates a cross-sectional view of an example TFT 100 structure after processes 230 and 235 (and process 237, where applicable). Vias 114 have a shape corresponding to first portion 142 and second portion 142 of S/D contacts 140.

Method 200 continues with depositing 240 the S/D contact metal (or metallic oxide) and planarizing the metallized structure to remove excess metal from the top of the ILD material 136. The planarization step can be performed using chemical mechanical polishing (CMP). Example contact metals include copper (Cu), tungsten (W), titanium oxynitride (e.g., $TiO_xN_y$ with x>0 and y>0), titanium (Ti), tantalum (Ta), tantalum nitride (e.g., TaN), aluminum titanium nitride (e.g., $AlTi_xN_y$ with 0<x<1 and y>0), indium titanium oxide (ITO), indium oxide (InO), indium zinc oxide (IZO), or reduced indium gallium zinc oxide (IGZO), to name a few. In some embodiments, the S/D contacts may be metal, such as copper interconnect, formed by a damascene process. In some embodiments, a contact metal is annealed, etched, or otherwise formed on or combined with the top surface 110a of the source and drain regions 132 of the semiconductor layer (e.g., TMD). For example, a silicide or other appropriate compound, depending on the contact metal, is formed as a S/D contact 140 on the active material 110.

Figure 6E:
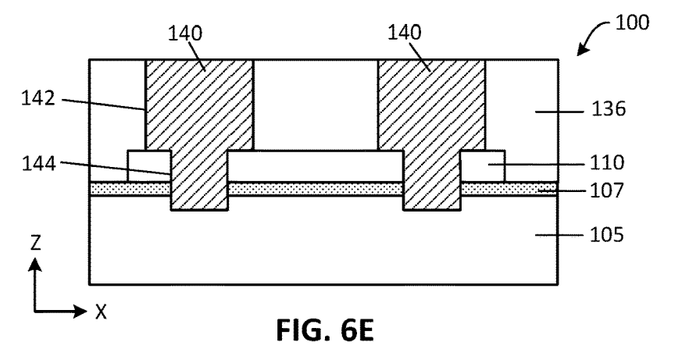

FIG. 6E illustrates an example TFT 100 structure after depositing 240 the metal of the S/D contacts 140 and planarizing. Prior to planarization, the metal(s) may be deposited as a blanket layer, for example. Planarization can be used to remove metal or other material above the top surface of the ILD material 136. Each S/D contact 140 has a larger first portion 142 on the top surface 110a of the active material 110 and a smaller second portion 144 that extends through the active material 110, through the etch-stop material 107, and into the substrate 105.

Method 200 continues with defining 245 a recess 139 in the ILD material 136 for the gate structure 120, followed by depositing 250 the gate structure 120 in the recess. In one embodiment, an anisotropic etch is used to define a recess in the ILD material 136 that extends down at least to the top surface 110a of the active material 110. In some embodiments, the recess extends part way into the active material 110. Optionally, the recess includes a first recess portion and a second recess portion corresponding to a first gate portion 125 and gate post(s) 126, respectively. In one example, defining 245 the recess for the gate structure 120 is performed as described above for processes 220, 225, 230, and 235 used for the S/D contacts 140. In some such embodiments, process 245 is performed in part using a DSA copolymer to define part of the recess for one or more gate posts 126. An example of an etch process using DSA copolymers is discussed above for process 230.

Figure 6F:
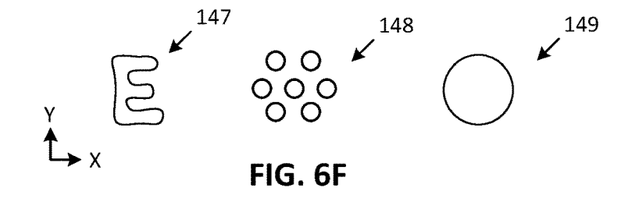

FIG. 6F illustrates a plan view (in the X-Y plane) of example shapes defined using a DSA copolymer. The shapes include an "E" shape 147, an array of circles 148, and a circle 149. Portions of the E shape 147 have a consistent size corresponding to a multiple of the pitch of the DSA copolymer. The array of circles 148 includes a plurality of circles of about the same size and having consistent spacing. The circle 149 has a size consistent with the pitch of the DSA copolymer. Numerous shapes and patterns may result, as will be appreciated.

Figure 6G:
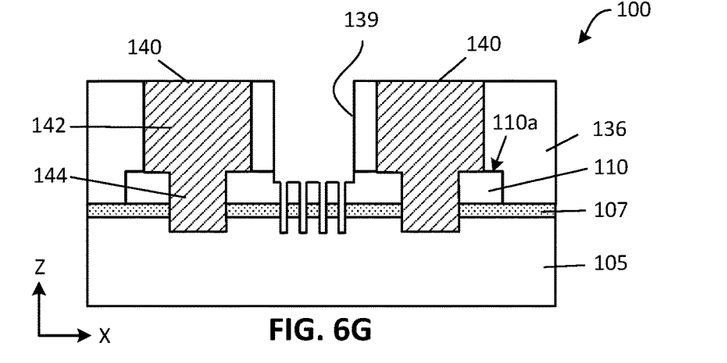

FIG. 6G illustrates an example of a TFT 100 structure after defining a recess 139 in the ILD material 136 for the gate structure 120. The recess 139 includes a larger first portion corresponding to the first gate portion 125 and a second portion corresponding to a plurality of gate posts 126. The recess extends through the active material 110 and into the substrate 105. S/D contacts 140 are formed with a first portion 142 in contact with a top surface 110a of the active material 110 and a second portion 144 that extends through the active material 110 into the substrate 105.

Method 200 continues with depositing 250 the gate dielectric 122 and gate electrode 124. In one embodiment, process 250 includes cleaning or other processing to prepare the recess for the gate structure. The gate dielectric 122 can be a high-κ dielectric material such as hafnium dioxide (HfO$_2$), or other high-κ material, for example. In some embodiments, the gate dielectric 122 is a multi-layer stack including, for example, a first layer of silicon dioxide (SiO$_2$) and a second layer of a high-κ dielectric such as HfO$_2$. Any number of gate dielectrics can be used, as will be appreciated in light of the present disclosure. In some embodiments, the gate dielectric 122 has a thickness in a range from 2 nm to 10 nm, including 4-7 nm. The gate electrode 124 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

Figure 6H:
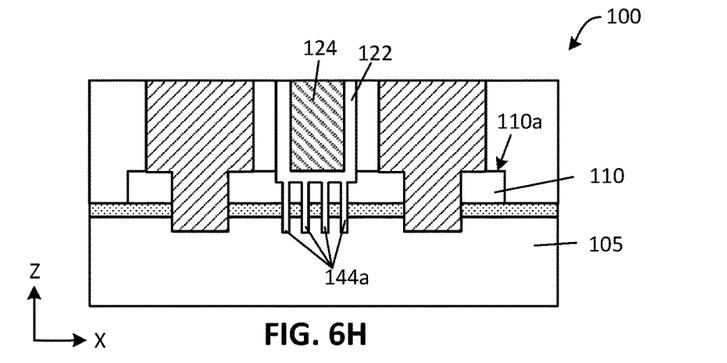

FIG. 6H illustrates a cross-sectional view of an example TFT 100 structure after depositing 250 the gate dielectric 122 and gate electrode 124. In this example, the gate dielectric 122 extends into posts 144a that extend through the active material 110. The gate electrode 144 resides at or near the top surface 110a of the active material 110. Posts 144a have a small cross-sectional area such that gate dielectric 122 fills the recesses during the deposition process.

Method 200 continues by completing 255 an integrated circuit (IC) implementing the TFT 100. In one embodiment, the integrated circuit includes a plurality of TFTs 100. Completing 255 the integrated circuit may include processing for electrical connections to other components in the IC, formation of metal interconnect, isolation structures, packaging, or other processing.

Although method 200 is discussed above as an example series of processes, it is to be understood that there is no required order to the processes unless specifically indicated. For example, conversion of a metal to TMD may occur at various stages of the method 200. Also, processing the gate structure 120 can occur before, concurrently with, or after processing for the S/D contacts 140. Method 200 has numerous variations as will be apparent.

Example System

Figure 7:
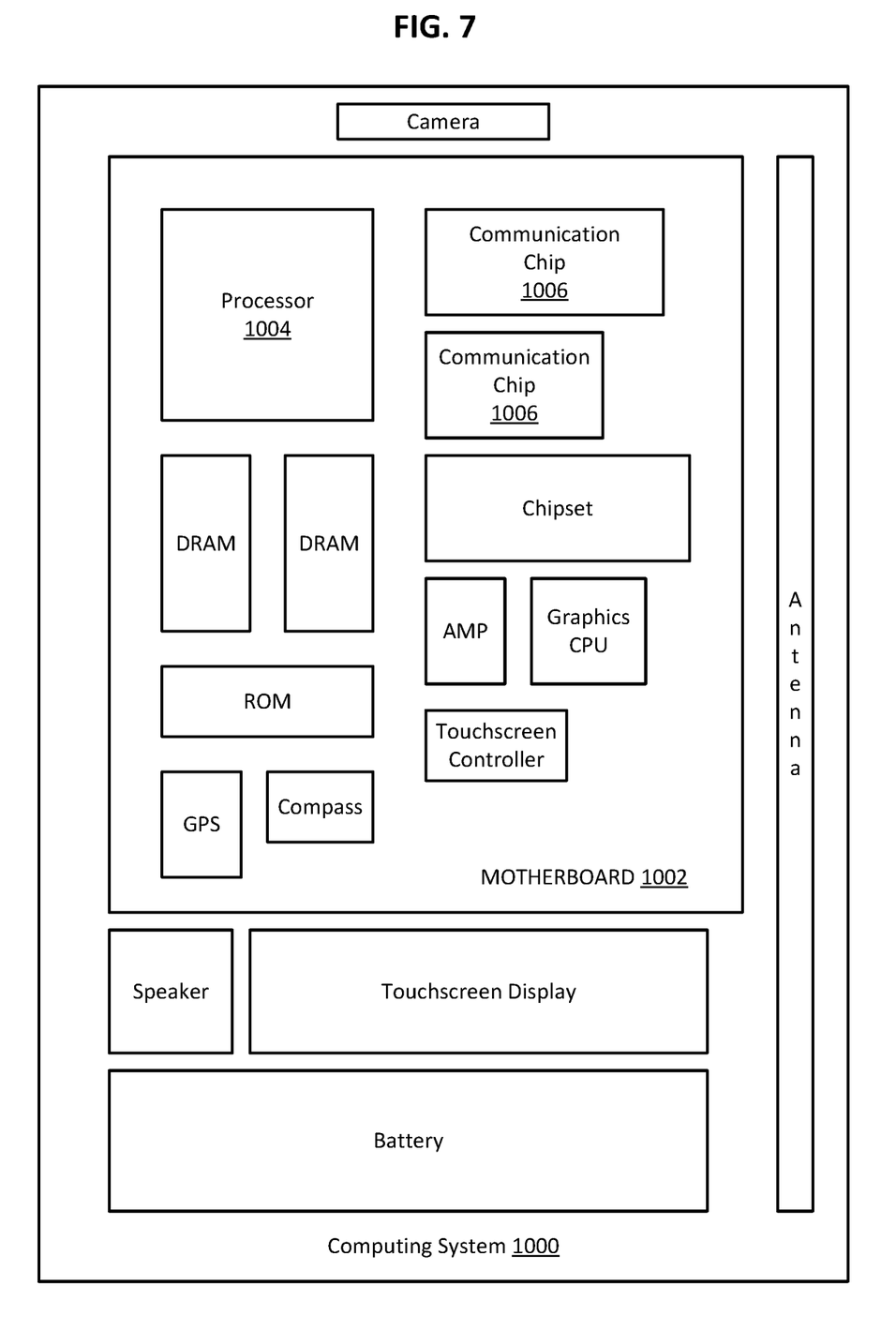
FIG. 7 illustrates an example computing system with an integrated circuit implementing transistor structures disclosed herein, in accordance with an embodiment of the present disclosure.

FIG. 7 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random access memory (DRAM) or embedded dynamic random access memory (eDRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells, one or more memory cell arrays) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is an integrated circuit comprising a layer of semiconductor material, the layer having a source region, a body region, and a drain region, wherein the body region is between the source region and the drain region; and one or more contacts including a first portion on a top surface of the layer and having a first horizontal dimension, and a second portion extending from the first portion through the layer, the second portion having a second horizontal dimension less than the first horizontal dimension; and a gate structure in contact with the body region of the layer, the gate structure including a gate dielectric and a gate electrode, wherein the gate dielectric is between the gate electrode and the body region.

Example 2 includes the subject matter of Example 1 and further comprises a substrate of electrically insulating material, wherein the substrate comprises a first insulating material; and a second insulating material on the first insulating material, the second insulating material being compositionally different from the first insulating material.

Example 3 includes the subject matter of Example 2, wherein the second insulating material has a vertical thickness no greater than 15 nm.

Example 4 includes the subject matter of any of Examples 1-3, wherein the second portion includes a plurality of posts extending from the first portion.

Example 5 includes the subject matter of any of Examples 1-4, wherein the gate structure includes one or more posts extending through the layer.

Example 6 includes the subject matter of Example 5, wherein the gate dielectric and the gate electrode each extends into the one or more posts.

Example 7 includes the subject matter of any of Examples 1-6, wherein the semiconductor material comprises a metal atom and a chalcogen atom.

Example 8 includes the subject matter of any of Examples 1-7, wherein the semiconductor material has a vertical thickness no greater than 5 nm.

Example 9 includes the subject matter of Example 7, wherein the chalcogen atom is selected from sulfur, selenium, and tellurium.

Example 10 includes the subject matter of Example 7 or 9, wherein the metal atom is selected from titanium, zirconium, silver, iron, zinc, osmium, vanadium, manganese, gold, cadmium, mercury, niobium, technetium, tantalum, hafnium, cobalt, ruthenium, chromium, copper, palladium, rhodium, nickel, molybdenum, tungsten, iridium, rhenium, and platinum.

Example 11 includes the subject matter of any of Examples 1-10 and further comprises an insulator between a portion of the one or more contacts and the layer.

Example 12 includes the subject matter of any of Examples 1-11, wherein the first horizontal dimension is at least 5 nm greater than the second horizontal dimension.

Example 13 includes the subject matter of Example 12, wherein the first horizontal dimension is at least 10 nm greater than the second horizontal dimension.

Example 14 includes the subject matter of any of Examples 1-13, further comprising an interconnect positioned laterally adjacent the layer.

Example 15 includes the subject matter of Example 14, wherein the interconnect comprises a metal and is spaced from the layer by no more than 100 nm.

Example 16 includes the subject matter of Example 15, wherein the interconnect is spaced from the layer by no more than 50 nm.

Example 17 includes the subject matter of Example 15, wherein the interconnect is spaced from the layer by no more than 20 nm.

Example 18 includes the subject matter of any of Examples 1-17, wherein the transistor structure includes at least one of a p-channel device and an n-channel device.

Example 19 includes the subject matter of Example 18, wherein the transistor structure is part of a complementary metal oxide semiconductor (CMOS) circuit.

Example 20 is an integrated circuit comprising a base comprising an electrically insulating material; a layer of active material on the base, the layer of active material having a channel portion between a source region and a drain region; a gate structure in contact with the channel portion, the gate structure including a gate electrode and a gate dielectric between the gate electrode and the active material; and an electrical contact on one or both of the source region and the drain region, the electrical contact including a larger portion in contact with a top surface of the active material and a smaller portion extending through the layer of active material into the base.

Example 21 includes the subject matter of Example 20, wherein the active material comprises a transition metal dichalcogenide.

Example 22 includes the subject matter of Example 20 or 21, wherein a portion of the gate structure extends at least partially through the layer of active material.

Example 23 includes the subject matter of Example 22, wherein the portion of the gate structure is a second portion of the gate structure having a smaller cross-sectional size than a first portion of the gate structure on a top surface of the channel portion.

Example 24 includes the subject matter of Example 23, wherein the second portion is one of a plurality of posts extending from the first portion of the gate structure.

Example 25 includes the subject matter of any of Examples 20-24, wherein the smaller portion of the electrical contact is one of a plurality of smaller portions extending through the layer of active material.

Example 26 includes the subject matter of any of Examples 20-25, wherein the layer of active material has a thickness no greater than 5 nm.

Example 27 includes the subject matter of any of Examples 20-26 and further comprises a metal interconnect adjacent the thin film transistor structure.

Example 28 includes the subject matter of Example 27, wherein the metal interconnect is spaced from the layer of active material by no more than 100 nm.

Example 29 includes the subject matter of Example 27, wherein the metal interconnect is spaced from the layer of active material by no more than 50 nm.

Example 30 includes the subject matter of any of Examples 20-29, wherein the electrical contact includes a source contact on the source region and a drain contact on the drain region.

Example 31 includes the subject matter of any of Examples 20-30, wherein the thin-film transistor structure is one of an array of transistors.

Example 32 includes the subject matter of any of Examples 20-31, wherein the smaller portion has a vertical height from 10 nm to 30 nm.

Example 33 includes the subject matter of Example any of claims 20-32 comprising a thin-film transistor.

Example 34 includes the subject matter of Example 33, wherein the thin-film transistor includes at least one of a p-channel device and an n-channel device.

Example 35 includes the subject matter of Example 33, wherein the thin-film transistor structure is part of a complementary metal oxide semiconductor (CMOS) circuit.

Example 36 is an integrated circuit comprising a substrate comprising an insulating material; and an array of transistor structures on the substrate, each transistor structure comprising a mesa of semiconductor material, the mesa having a channel region between a source region and a drain region; a gate structure in contact with the channel region, the gate structure including a gate electrode and a gate dielectric between the gate electrode and the semiconductor material; and electrical contacts on the source region and the drain region, each of the electrical contacts including a larger portion in contact with a top surface of the mesa and a smaller portion extending through the semiconductor material, wherein the larger portion and the smaller portion are monolithic.

Example 37 includes the subject matter of Example 36 and further comprises a wordline electrically coupled to the gate electrode of each transistor structure in the array of transistor structures; and a bitline electrically coupled to one of the electrical contacts of each transistor structure in the array of transistor structures.

Example 38 includes the subject matter of Examples 36 or 37, wherein the semiconductor material comprises a metal and a chalcogen.

Example 39 includes the subject matter of any of Examples 36-38, wherein the semiconductor material comprises a transition metal dichalcogenide.

Example 40 includes the subject matter of any of Examples 36-39, wherein the mesa of semiconductor material has a vertical thickness no greater than 10 nm.

Example 41 includes the subject matter of Example 40, wherein the vertical thickness is no greater than 5 nm.

Example 42 includes the subject matter of any of Examples 36-41, wherein a portion of the gate structure extends at least partially through the semiconductor material.

Example 43 includes the subject matter of any of Examples 36-42 and further comprises an interconnect comprising a metal, the interconnect spaced from one or more of the transistor structures by no more than 100 nm.

Example 44 includes the subject matter of Example 43, wherein the interconnect is spaced from one or more of the transistor structures by no more than 50 nm.

Example 45 includes the subject matter of any of Examples 36-44, wherein the smaller portion of the electrical contacts comprises two or more portions extending through the semiconductor material.

Example 46 includes the subject matter of any of Examples 36-45, wherein the smaller portion of the electrical contacts extends into the substrate.

Example 47 includes the subject matter of any of Examples 36-46 and further comprises a second insulator between the substrate and the mesa of semiconductor material, the second insulator being compositionally different from the substrate.

Example 48 is a memory structure comprising the integrated circuit of any of claims 36-47.

Example 49 includes the subject matter of Example 48, wherein the memory structure is one of a DRAM module or an eDRAM module.

Example 50 is a computing system comprising the integrated circuit of any of claims 1-47.

Example 51 includes the subject matter of Example 50 further comprising a touch screen display.

Example 52 includes the subject matter of Example 50 or 51 and further comprises a processor.

Example 53 includes the subject matter of any of Examples 50-52 and further comprises a communication chip.

Example 54 is a method of fabricating a thin-film transistor structure, the method comprising forming a mesa of semiconductor material on an insulating substrate; depositing an insulating dielectric over the mesa; defining a contact via in the insulating dielectric positioned over and exposing a portion of the mesa; depositing a sacrificial spacer material on vertical walls of the contact via; etching a hole through the mesa between the sacrificial spacer material on vertical walls of the contact via; removing the sacrificial spacer material from vertical walls of the contact via; and depositing a conductive material in the via and hole.

Example 55 includes the subject matter of Example 54, wherein the mesa comprises a transition metal dichalcogenide.

Example 56 includes the subject matter of Examples 54 or 55, wherein a vertical thickness of the mesa is no greater than 5 nm.

Example 57 includes the subject matter of any of Examples 54-56, wherein the hole has a vertical depth from 10-30 nm.

Example 58 includes the subject matter of any of Examples 54-57, wherein etching the hole includes etching the hole to extend into the insulating substrate.

Example 59 includes the subject matter of any of Examples 54-58 and further comprises patterning a mask on the mesa exposed by the contact via, the mask defining a plurality of openings, wherein etching the hole includes etching a hole for each of the plurality of openings; and removing the mask prior to depositing the conductive material.

Example 60 includes the subject matter of Example 59, wherein patterning the mask comprises depositing a solution of copolymers configured for directed self-alignment; curing the solution; and removing one of the copolymers of the solution.

Example 61 includes the subject matter of any of Examples 54-60 and further comprises selecting the portion of the mesa as corresponding to a source region and/or a drain region.

Example 62 includes the subject matter of any of Examples 54-61 and further comprises defining a gate recess in the insulating dielectric, the gate recess corresponding to and exposing a channel region of the mesa; defining a gate post recess extending vertically at least part way through the channel region of the mesa; depositing a gate dielectric in the gate recess and gate post recess; and depositing a gate electrode in at least the gate recess, wherein the gate dielectric is between the gate electrode and the semiconductor material.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a layer of semiconductor material, the layer having a source region, a body region, and a drain region, wherein the body region is between the source region and the drain region;
   a first contact and a second contact, each of the first contact and the second contact including a first portion on a top surface of the layer and having a first horizontal dimension, and a second portion extending from the first portion through the layer, the second portion having a second horizontal dimension less than the first horizontal dimension; and
   a gate structure in contact with the body region of the layer, the gate structure including a gate dielectric and a gate electrode, wherein the gate dielectric is between the gate electrode and the body region.

2. The integrated circuit of claim 1, further comprising a substrate of electrically insulating material, wherein the substrate comprises:
   a first insulating material; and
   a second insulating material on the first insulating material, the second insulating material being compositionally different from the first insulating material.

3. The integrated circuit of claim 2, wherein the second insulating material has a vertical thickness no greater than 15 nm.

4. The integrated circuit of claim 1, wherein the second portion includes a plurality of posts extending from the first portion.

5. The integrated circuit of claim 1, wherein the gate structure includes one or more posts extending through the layer.

6. The integrated circuit of claim 5, wherein the gate dielectric and the gate electrode each extends into the one or more posts.

7. The integrated circuit of claim 1, wherein the semiconductor material comprises a metal atom and a chalcogen atom.

8. The integrated circuit of claim 1 further comprising an insulator between a portion of the one or more contacts and the layer.

9. The integrated circuit of claim 1, wherein the first horizontal dimension is at least 5 nm greater than the second horizontal dimension.

10. The integrated circuit of claim 1 further comprising an interconnect positioned laterally adjacent the layer, wherein the interconnect comprises a metal and is spaced from the layer by no more than 100 nm.

11. An integrated circuit comprising:
    a base comprising an electrically insulating material;
    a layer of active material on the base, the layer of active material having a channel portion between a source region and a drain region;
    a gate structure in contact with the channel portion, the gate structure including a gate electrode and a gate dielectric between the gate electrode and the active material; and
    an electrical contact on one or both of the source region and the drain region, the electrical contact including a larger portion in contact with a top surface of the active material and a smaller portion extending through the layer of active material into the base.

12. The integrated circuit of claim 11, wherein the active material comprises a transition metal dichalcogenide.

13. The integrated circuit of claim 11, wherein a portion of the gate structure extends at least partially through the layer of active material.

14. The integrated circuit of claim 13, wherein the portion of the gate structure is a second portion of the gate structure having a smaller cross-sectional size than a first portion of the gate structure on a top surface of the channel portion.

15. The integrated circuit of claim 14, wherein the second portion is one of a plurality of posts extending from the first portion of the gate structure.

16. The integrated circuit of claim 11, wherein the smaller portion of the electrical contact is one of a plurality of smaller portions extending through the layer of active material.

17. The integrated circuit of claim 11 further comprising a metal interconnect adjacent the thin film transistor structure, wherein the metal interconnect is spaced from the layer of active material by no more than 100 nm.

18. A method of fabricating a thin-film transistor structure, the method comprising:
    forming a mesa of semiconductor material on an insulating substrate;
    depositing an insulating dielectric over the mesa;
    defining a contact via in the insulating dielectric positioned over and exposing a portion of the mesa;
    depositing a sacrificial spacer material on vertical walls of the contact via;
    etching a hole through the mesa between the sacrificial spacer material on vertical walls of the contact via;

removing the sacrificial spacer material from vertical walls of the contact via; and depositing a conductive material in the contact via and hole.

19. The method of claim 18, wherein the mesa comprises a transition metal dichalcogenide.

20. The method of claim 18, wherein etching the hole includes etching the hole to extend into the insulating substrate.

21. An integrated circuit comprising:
a layer of semiconductor material, the layer having a source region, a body region, and a drain region, wherein the body region is between the source region and the drain region; and
one or more contacts including a first portion on a top surface of the layer and having a first horizontal dimension, and a second portion extending from the first portion through the layer, the second portion having a second horizontal dimension less than the first horizontal dimension, wherein the second portion includes a plurality of posts extending from the first portion; and
a gate structure in contact with the body region of the layer, the gate structure including a gate dielectric and a gate electrode, wherein the gate dielectric is between the gate electrode and the body region.

22. An integrated circuit comprising:
a layer of semiconductor material, the layer having a source region, a body region, and a drain region, wherein the body region is between the source region and the drain region; and
one or more contacts including a first portion on a top surface of the layer and having a first horizontal dimension, and a second portion extending from the first portion through the layer, the second portion having a second horizontal dimension less than the first horizontal dimension; and
a gate structure in contact with the body region of the layer, the gate structure including a gate dielectric and a gate electrode, wherein the gate dielectric is between the gate electrode and the body region, and wherein the gate structure includes one or more posts extending through the layer.

* * * * *